(12) United States Patent
Hisanaga

(10) Patent No.: US 7,972,928 B2
(45) Date of Patent: Jul. 5, 2011

(54) INSULATED GATE-TYPE SEMICONDUCTOR DEVICE AND MANUFACTURING METHOD THEREOF

(75) Inventor: Yukihiro Hisanaga, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 59 days.

(21) Appl. No.: 11/445,206

(22) Filed: Jun. 2, 2006

(65) Prior Publication Data

US 2006/0273387 A1 Dec. 7, 2006

(30) Foreign Application Priority Data

Jun. 3, 2005 (JP) .................................. 2005-163608

(51) Int. Cl.
*H01L 21/336* (2006.01)

(52) U.S. Cl. ................ 438/270; 438/287; 257/E21.384; 257/E21.41

(58) Field of Classification Search ............. 257/E21.17, 257/E21.384, E21.41, 330; 438/270, 287
See application file for complete search history.

(56) References Cited

U.S. PATENT DOCUMENTS

| | | | | |
|---|---|---|---|---|
| 6,107,654 A * | 8/2000 | Yamazaki | ...................... | 257/194 |
| 6,448,139 B2 * | 9/2002 | Ito et al. | ........................ | 438/270 |
| 6,635,950 B1 * | 10/2003 | Ishida et al. | ................... | 257/607 |
| 7,148,154 B2 * | 12/2006 | Hyodo et al. | .................. | 438/778 |
| 7,173,307 B2 * | 2/2007 | Hayashi et al. | ................ | 257/330 |
| 2002/0153565 A1 * | 10/2002 | Yamazaki et al. | ............ | 257/347 |
| 2004/0145011 A1 * | 7/2004 | Hsu et al. | ....................... | 257/330 |
| 2004/0217354 A1 * | 11/2004 | Kamo et al. | .................... | 257/72 |

FOREIGN PATENT DOCUMENTS

| | | |
|---|---|---|
| DE | 694 28 387 | 7/2002 |
| EP | 0612102 B1 | 9/2001 |
| JP | 05-206453 | 8/1993 |
| JP | 08-008263 | 1/1996 |
| JP | 09-260369 | 10/1997 |
| JP | 11-297689 | 10/1999 |
| JP | 2000-091336 | 3/2000 |
| JP | 2001-036078 | 2/2001 |
| JP | 2003-045996 | 2/2003 |
| JP | 2003-110100 | 4/2003 |
| JP | 2004-103882 | 4/2004 |
| JP | 2004-146679 | 5/2004 |
| WO | WO 2005036650 A2 * | 4/2005 |

* cited by examiner

*Primary Examiner* — Colleen A Matthews
(74) *Attorney, Agent, or Firm* — Finnegan, Henderson, Farabow, Garrett & Dunner, LLP

(57) ABSTRACT

This invention has a purpose to provide an insulated gate-type semiconductor device and its manufacturing method in which a decrease in gate insulation dielectric strength voltage and a reduction in manufacturing costs are both achieved. First, (a) a CZ bulk substrate is prepared. Next, (b) P⁻ diffused layer and N⁺ diffused layer 31 are formed by executing processes such as ion implantation and thermal diffusion treatment. Further (c) a gate trench is formed by reactive ion etching. Next, (d) a gate insulation film containing carbon of $1.0 \times 10^{18}$ atoms/cm³ is formed on the wall face of a gate trench according to a CVD method and, annealing is subsequently performed. As a consequence, a low defect area is formed in the vicinity of an interface between the CZ bulk substrate and the gate insulation film.

14 Claims, 6 Drawing Sheets

FIG.2
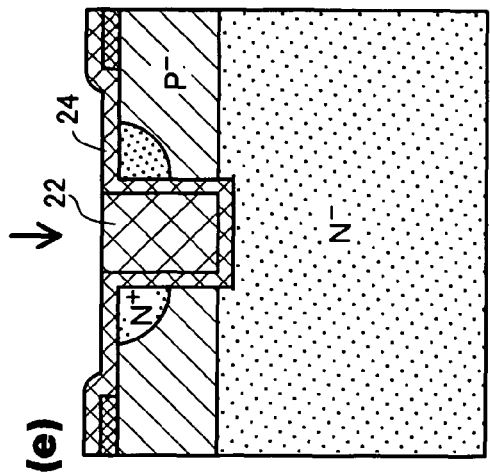
(a)
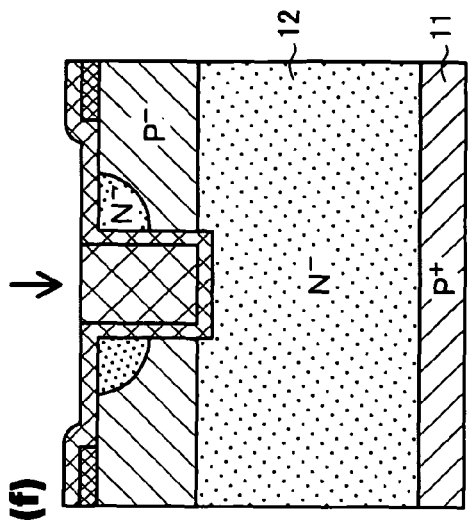
(b)
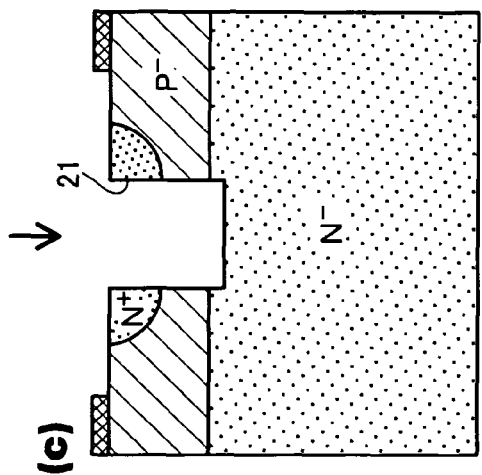
(c)
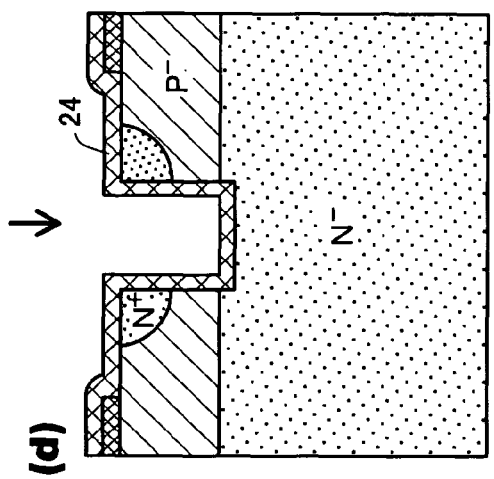
(d)
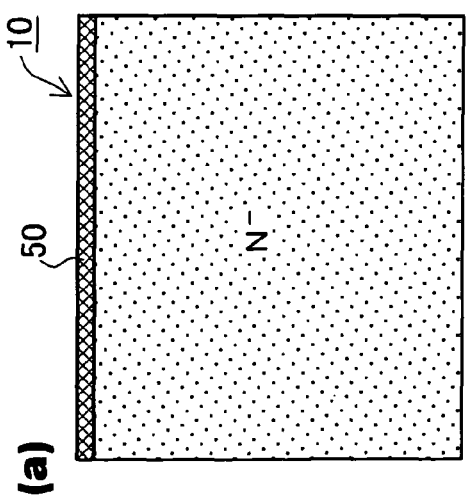
(e)
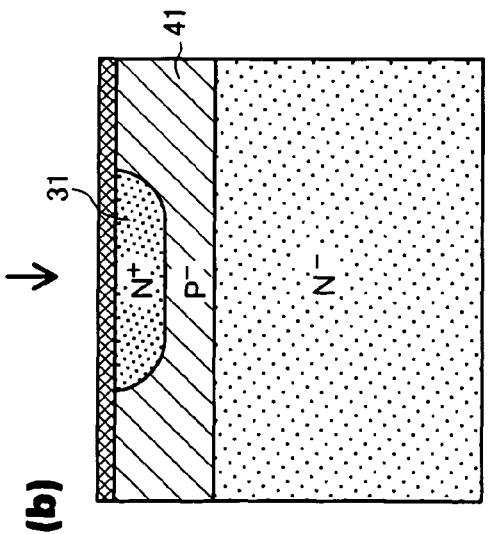
(f)

INSULATED GATE-TYPE SEMICONDUCTOR DEVICE AND MANUFACTURING METHOD THEREOF

BACKGROUND OF THE INVENTION

1. Field of the Invention

The present invention relates to an insulated gate-type semiconductor device, and a manufacturing method thereof. More particularly the present invention relates to an insulated gate type semiconductor device which is formed on the surface portion of a silicon substrate manufactured according to the CZochralski (CZ) process, and to a manufacturing method of the same semiconductor device.

2. Description of Related Art

Conventionally, a trench gate-type semiconductor device having a trench gate structure has been proposed as an insulated gate-type semiconductor device for power devices. In this trench gate-type semiconductor device, a gate insulation film about 100 nm thick is formed along the side wall of the trench in order to secure a generally high gate dielectric strength voltage. This gate insulation film is usually formed by means of thermal oxidation processing such as pyrogenic oxidation and dry oxidation.

Meanwhile, oxygen precipitates exist in the vicinity of the side wall of a trench. If it is intended to form the thick gate insulation film, the incidence of the oxygen precipitates taken into the inside of the gate insulation film increases. This oxygen precipitate acts as a weak spot in the gate insulation film, inducing a decrease in the gate dielectric strength voltage. To prevent the characteristics of the gate insulation film from deteriorating, accordingly, the concentration of oxygen in a wafer during an initial period is preferably $1.0 \times 10^{16}$ atoms/cm$^3$ or less in the area of the device in which the gate insulation film is to be formed.

As a semiconductor substrate for solving this problem, there is a wafer manufactured according to a Floating Zone (FZ) method (hereinafter a wafer manufactured according to the FZ method is referred to as a FZ wafer) (see Japanese unexamined patent publication No. 2004-103882). Because no silica crucible is used for manufacturing the FZ wafer, its oxygen concentration is lower than $1.0 \times 10^{16}$ atoms/cm$^3$.

Because a wafer manufactured according to the CZ method (hereinafter, a wafer manufactured according to the CZ method is referred to as a CZ wafer) has an oxygen concentration of $1.0 \times 10^{17}$ atoms/cm$^3$ or more, it is not suitable for purposes of forming the gate insulation film by thermal oxidation processing. Thus, when this wafer is used, an area with a low level at oxygen concentration is secured by forming an epitaxial layer having a desired thickness on the surface of a silicon substrate.

However, the above-described conventional techniques have the following problems. Specifically, the FZ wafer is low in mechanical strength, which tends to be cracked or slipped. Further, a wafer of a larger diameter than conventional wafers is demanded for the manufacture of semiconductor devices for power devices. However, although the diameter of a CZ wafer is generally about 200 mm, the diameter of a FZ wafer is mainly about 150 mm. Additionally, as compared with the CZ wafer, a FZ wafer has a lower throughput of production and the wafer itself is very expensive.

The mechanical strength of a CZ wafer can be improved and in its diameter can be increased in comparison with the FZ wafer. However, in the CZ wafer, a layer with a low level of defects (an epitaxial layer) needs to be formed by epitaxial growth on a wafer having a high level of oxygen concentration. Thus, the manufacturing process of a CZ wafer is complicated, thereby leading to a decrease in throughput in production and an increase in production cost.

Another method is a well known method for forming a layer with a low level of defects (a DZ layer) on the surface of a wafer by annealing (hydrogen annealing) at a temperature around 1200° C. in a hydrogen atmosphere to diffuse oxygen on the surface of the wafer outwardly. For the hydrogen annealing, however, a special apparatus needs to be additionally provided. Thus, not only is the manufacturing process complicated but also the initial costs are increased.

SUMMARY OF THE INVENTION

The present invention has been achieved to solve the problem described above of the conventional insulated gate-type semiconductor device. Specifically, the invention has an object to provide an insulated gate-type semiconductor device capable of suppressing a decrease in gate insulation dielectric strength voltage and also achieving a reduction in manufacturing costs, and a manufacturing method thereof.

To achieve the purpose of the invention, there is provided a manufacturing method of an insulated gate type semiconductor device made up of a silicon substrate manufactured according to the Czochralski (CZ) process, comprising: an insulation film-forming step of forming on a surface of the silicon substrate a gate insulation film having a carbon content of more than $1.0 \times 10^{17}$ atoms/cm$^3$; and a step of annealing the silicon substrate on which the insulation film has been formed.

According to another aspect, the present invention provides a manufacturing method of an insulated gate-type semiconductor device made up of a silicon substrate manufactured according to the Czochralski (CZ) process, comprising: an insulation film-forming step of forming a gate insulation film having a higher concentration of carbon than an oxygen concentration of the silicon substrate; and a step of annealing the silicon substrate on which the insulation film has been formed.

In other words, according to the manufacturing method of the present invention, a silicon substrate manufactured as a starting substrate according to the CZ method (including a MCZ method) is used. Thus, the insulated gate type semiconductor device manufactured according to the manufacturing method of the present invention has a higher level of mechanical strength than the FZ wafer, and the silicon substrate itself is more inexpensive.

In the gate insulation film-forming step, a gate insulation film is formed in which carbon is intentionally contained after that, a step of annealing processing is carried out. The annealing process may be performed simultaneously when a gate electrode is formed. The carbon concentration of the gate insulation film needs to be equal to, or higher than, the oxygen concentration of the silicon substrate. Although generally, the oxygen concentration of the CZ wafer is $1.0 \times 10^{17}$ atoms/cm$^3$ or more, the gate insulation film may be applied if it contains carbon of $1.0 \times 10^{17}$ atoms/cm$^3$ or more. By forming a gate insulation film that contains more than a predetermined amount of carbon, oxygen precipitate is removed from an area of the silicon substrate in the vicinity of the gate insulation film. In other words, oxygen precipitates in the CZ wafer are reduced and removed ($SiO_x + C \rightarrow Si + CO\uparrow$) during the annealing processing that takes place after the gate insulation film has been formed. Thus, a low defect area containing very few oxygen precipitate defects is formed in the vicinity of the interface between the gate insulation film and the CZ wafer.

Thus, even if the gate insulation film is formed on the surface of the CZ wafer, a decrease in the gate insulation dielectric strength voltage can be avoided. Further, because the low defect area is formed without an epitaxial layer being formed, the manufacturing process is simple, so that an increase in the manufacturing costs and a reduction in throughput can be suppressed.

According to another aspect, the present invention provides an insulated gate-type semiconductor device made up of a silicon substrate manufactured according to the Czochralski (CZ) process, comprising: a gate electrode area; and a gate insulation film that makes contact with the silicon substrate and insulates the gate electrode area from the silicon substrate, wherein the gate insulation film is formed as an insulation film having a carbon content of more than $1.0 \times 10^{17}$ atoms/cm$^3$ and is subsequently completed by annealing.

Further, according to another aspect, the present invention provides an insulated gate type semiconductor device made up of a silicon substrate manufactured according to the Czochralski (CZ) process, comprising: a gate electrode area; and a gate insulation film that makes contact with the silicon substrate and insulates the gate electrode area from the silicon substrate, wherein the gate insulation film is formed as an insulation film having a higher concentration of carbon than an oxygen concentration of the silicon substrate and is subsequently completed by annealing after that.

BRIEF DESCRIPTION OF THE DRAWINGS

FIG. 2 is a diagram showing a manufacturing process of the semiconductor device according to the embodiment of the present invention;

DETAILED DESCRIPTION OF THE PREFERRED EMBODIMENTS

Hereinafter, the preferred embodiments of the present invention will be described in detail, with reference to the accompanying drawings. According to this embodiment, the present invention is applied to a trench gate type insulated gate bipolar transistor (IGBT) which controls conduction between the collector and the emitter, by applying voltage to a gate electrode.

Figure 1:
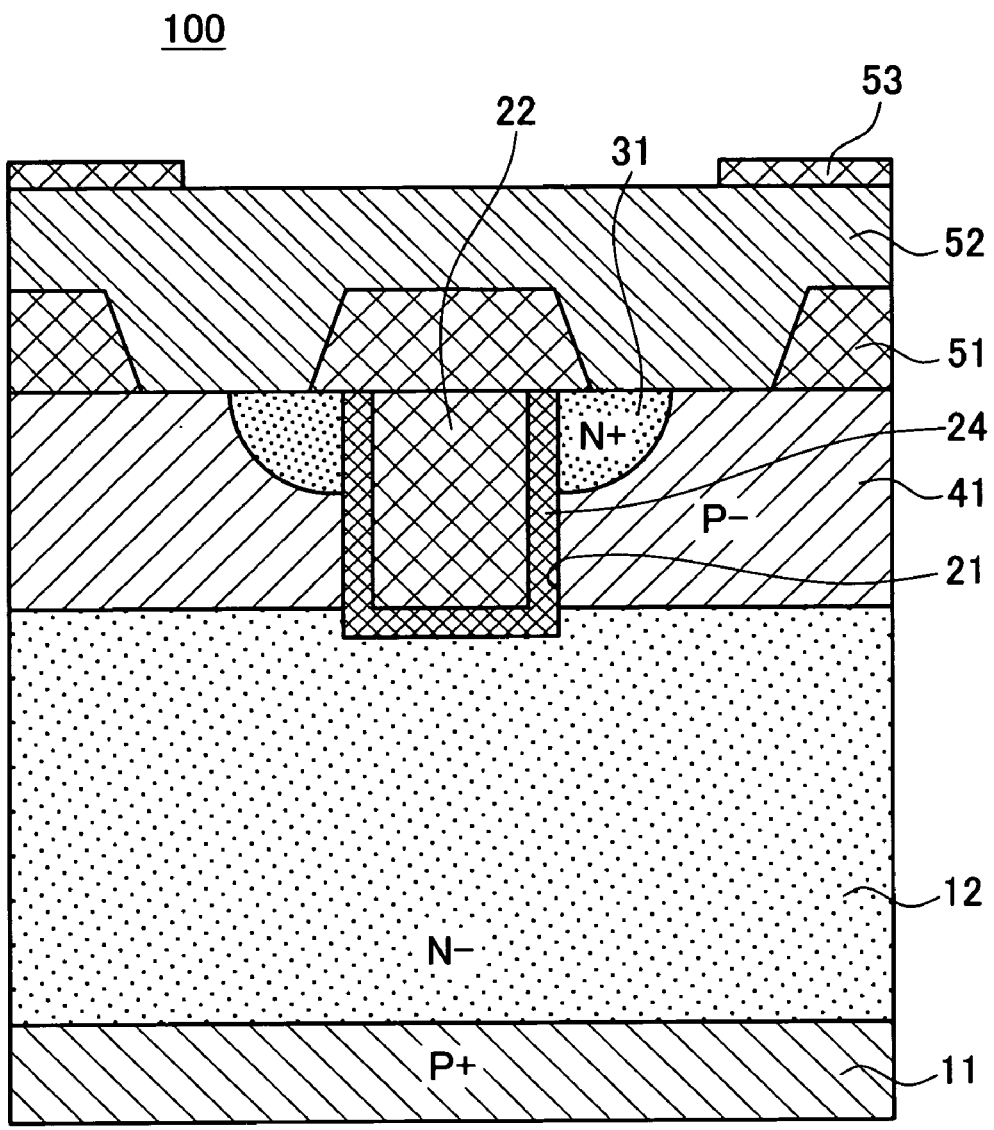
FIG. 1 is a sectional view showing the structure of a semiconductor device according to an embodiment of the present invention.

The semiconductor device 100 of this embodiment has the structure shown in FIG. 1. In the semiconductor device 100, N$^+$ emitter area 31 is provided on the upper side of the semiconductor substrate. On the other hand, P$^+$ collector area 11 is provided on the bottom side. P$^-$ base area 41 and N$^-$ drift area 12 are provided in that order from the upper side of the area separating them. A gate trench 21 which extends through N$^+$ emitter area 31 and P$^-$ base area 41 is formed by digging a part on the upper side of the semiconductor substrate. The gate trench 21 is formed by digging from the surface of the semiconductor substrate by reactive ion etching and its depth is about 4.5 μm.

A gate electrode 22 of polysilicon is formed inside the gate trench 21. The gate electrode 22 opposes the N$^+$ emitter area 31 and the P$^-$ base area 41 through a gate insulation film 24 formed on the wall face of the gate trench 21. That is, the gate electrode 22 is insulated from the N$^+$ emitter area 31 and the P$^-$ base area 41 by the gate insulation film 24. The gate insulation film 24 is a layer deposited on the wall face of the trench gate 21 according to a Chemical Vapor Deposition (CVD) method, and its thickness is about 100 nm. Details of the gate insulation film 24 will be described later. Additionally, an interlayer insulation film 51, an Al electrode 52 and a passivation protective film 53 are formed.

In the semiconductor device 100 having such a structure, a channel effect is generated in the P$^-$ base area 41 by applying voltage to the gate electrode 22 so as to control conduction between the N$^+$ emitter area 31 and the P$^+$ collector area 11.

Subsequently, the manufacturing process of the semiconductor device 100 shown in FIG. 1 will be described with reference to FIG. 2. First, as shown in FIG. 2(a), an N type CZ bulk substrate 10 is prepared. The specific resistance of the CZ bulk substrate 10 is about 50 Ωcm. The oxygen concentration of the CZ bulk substrate 10 is about $4.0 \times 10^{17}$ atoms/cm$^3$. In the meantime, generally, the oxygen concentration of the CZ wafer is in a range of from $4.0 \times 10^{17}$ atoms/cm$^3$ to $15.0 \times 10^{17}$ atoms/cm$^3$ and the CZ bulk substrate 10 can be applied within this range. Further, a field oxide film 50 is formed on the surface of the CZ bulk substrate 10.

Next, as shown in FIG. 2(b), the P$^-$ diffused layer 41 and N$^+$ diffused layer 31 are formed by executing a process such as ion implantation, thermal diffusion treatment, or the like. The P$^-$ diffused layer 41 is an area corresponding to the P$^-$ base area 41 in FIG. 1, and the N$^+$ diffused layer 31 is an area corresponding to the N$^+$ emitter area 31 in FIG. 1. At this time, interstitial oxygen existing in the CZ bulk substrate 10 as foreign matter is turned into oxygen precipitate SiO$_x$ by heat treatment. In other words, oxygen precipitate defects are generated in the CZ bulk substrate 10.

Next, the gate trench 21 which extends through the N$^+$ diffused layer 31 and the P$^-$ diffused layer 41, while its bottom portion reaches the N$^-$ layer 12, is formed as shown in FIG. 2(c) by reactive ion etching.

Next, as shown in FIG. 2(d), the oxide film 24 is formed on the wall face of the gate trench 21 according to the CVD method (hereinafter, oxide film manufactured according to the CVD method is called CVD oxide film). More specifically, a low pressure CVD method using Si(OC$_2$H$_5$)$_4$ (tetraethoxysilane, abbreviated as TEOS) or Si(OCH$_3$)$_4$ (tetramethoxysilane) as its material gas is suitable. As film-formation conditions, film-formation temperature was 700° C., a film-formation pressure was 60 Pa and the flow rate of the TEOS gas was set to 150 sccm. This CVD oxide film 24 is deposited as the gate insulation film 24 in FIG. 1. After the CVD oxide film 24 has been formed, annealing (900° C. to 1000° C.) is carried out for 10 to 30 minutes.

CVD oxide film containing carbon of about $1.0 \times 10^{18}$ atoms/cm$^3$ is formed by using as a material gas in this process TEOS which is a carbon organic compound. These carbons (C) have a function of reducing/removing oxygen precipitate (SiO$_x$) existing in the vicinity of an interface between the silicon substrate (CZ bulk substrate 10) and oxide film 24 (SiO$_x$+C→Si+CO↑). As a result, a low defect area is formed in the vicinity of the interface and oxygen precipitate defects taken in the gate insulation film 24 are reduced. Thus, any decrease in gate dielectric strength voltage can be avoided.

In the meantime, the CVD oxide film 24 can perform a function of reducing/removing oxygen precipitate if the carbon concentration is equal to or higher than the oxygen concentration of the CZ bulk substrate 10. According to this embodiment, the carbon concentration ($1.0 \times 10^{18}$ atoms/cm$^3$) of the CVD oxide film 24 is higher than the oxygen concentration ($4.0 \times 10^{17}$ atoms/cm$^3$) of the CZ bulk substrate 10.

The gate insulation film is not restricted to a single layer structure of the CVD oxide film. For example, it may be of a laminated structure composed of thermally oxidized film and CVD oxide film. That is, after the thermally oxidized film is formed by means of thermal oxidation processing, the CVD oxide film is deposited. A low charge density level between Si and the oxide film is achieved by forming a thermally oxidized film. In the gate insulation film having this laminated structure, carbon of about $1.0 \times 10^{19}$ atoms/cm$^3$ is contained in the CVD oxide film. If the thickness of the thermal oxide film is too great, incorporation of oxygen precipitates becomes conspicuous, and in consequence the dielectric strength voltage may decrease. Thus, it is preferable that the thermal oxide film be less than 40 nm.

Next, gate material 22 is deposited to space into a the gate trench 21 according to a method such as the CVD method, as shown in FIG. 2(e). More specifically, as the film formation condition of the gate material 22, for example, a compound gas containing SiH$_4$ is used as the reactive gas, the film formation temperature is set to 580° C. to 640° C. and polysilicon film about 800 nm thick is formed according to the low pressure CVD method. This polysilicon film acts as the gate electrode 22. As the method for forming the gate electrode 22, not only a method of depositing doped polysilicon containing impurities such as P, B directly into the gate trench but also a method is available of diffusing impurities into the insulation layer after depositing non-doped polysilicon having a high resistance.

The P$^+$ diffused layer 11 is formed as shown in FIG. 2(f) by executing ion implantation, thermal diffusion treatment or the like to the back side surface of the substrate. The P$^+$ diffused layer 11 acts as the P$^+$ collector area 11 in FIG. 1. Finally, the semiconductor device 100 shown in FIG. 1 is manufactured by forming items such as the interlayer insulation film 51, the Al electrode 52 and the passivation protective film 53.

In the meantime, the carbon concentration of the gate insulation film 24 in the semiconductor device 100 becomes lower than the carbon concentration ($1.0 \times 10^{18}$ atoms/cm$^3$) prevailing just after the film was formed by annealing. If SiH$_4$/N$_2$O is used as the material gas, the carbon concentration after the film formation becomes less than $1.0 \times 10^{16}$ atoms/cm$^3$. Thus, the amount of reduced oxygen precipitate is small and therefore, an increase in dielectric strength voltage cannot be expected.

Subsequently, 100 semiconductor devices (semiconductor devices of this embodiment) having a gate insulation film intentionally loaded with carbon and 100 semiconductor devices (conventional semiconductor devices) having a gate oxide film formed by means of ordinary thermal oxidation were prepared, and the gate dielectric strength voltage of each type of semiconductor device was investigated. The thickness of the gate insulation film of each semiconductor device was 100 nm.

Figure 3:
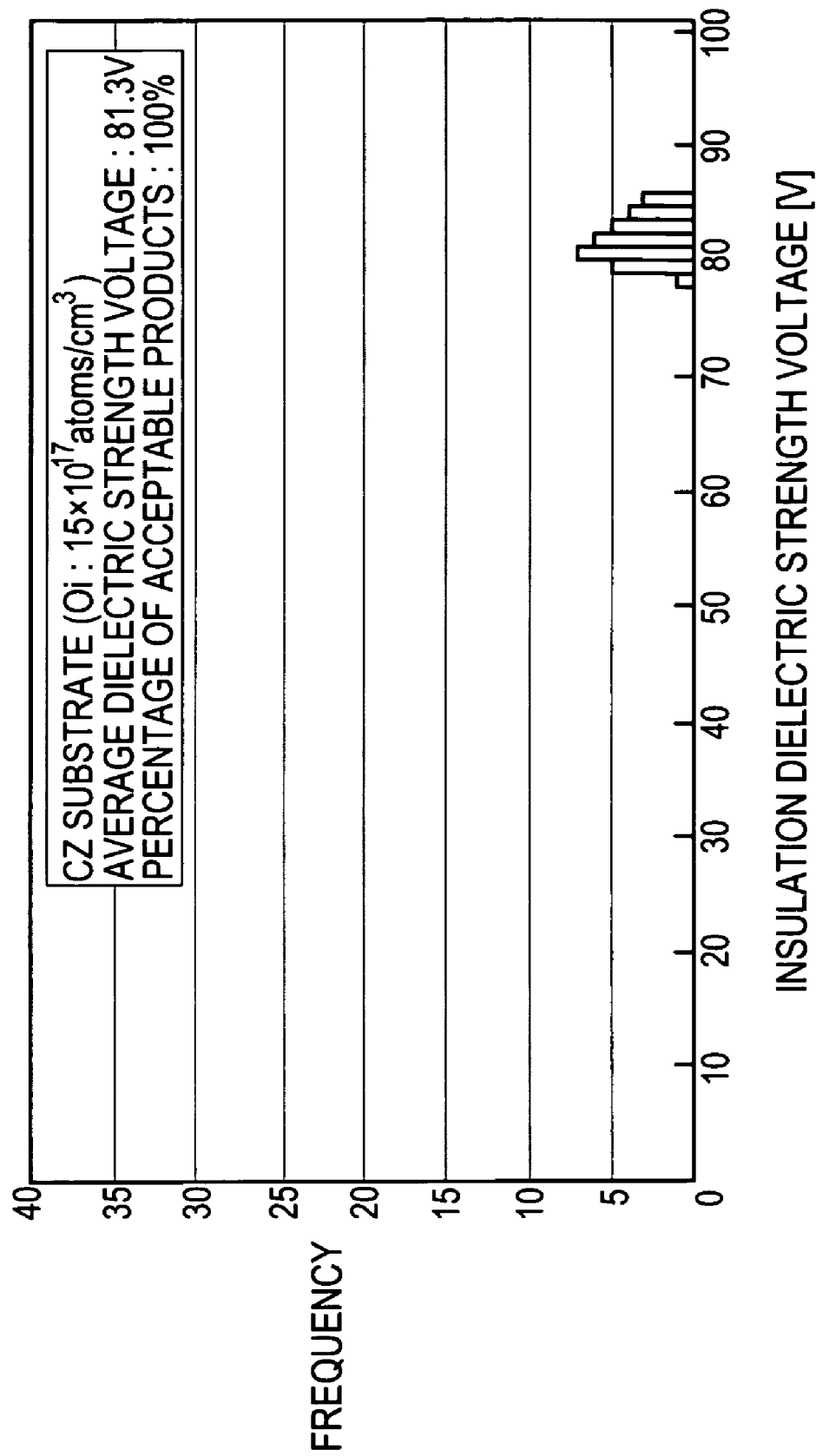
FIG. 3 is a histogram showing the distribution of gate dielectric strength voltage in the semiconductor device of the embodiment (having a high level of oxygen concentration on the CZ substrate)
Figure 4:
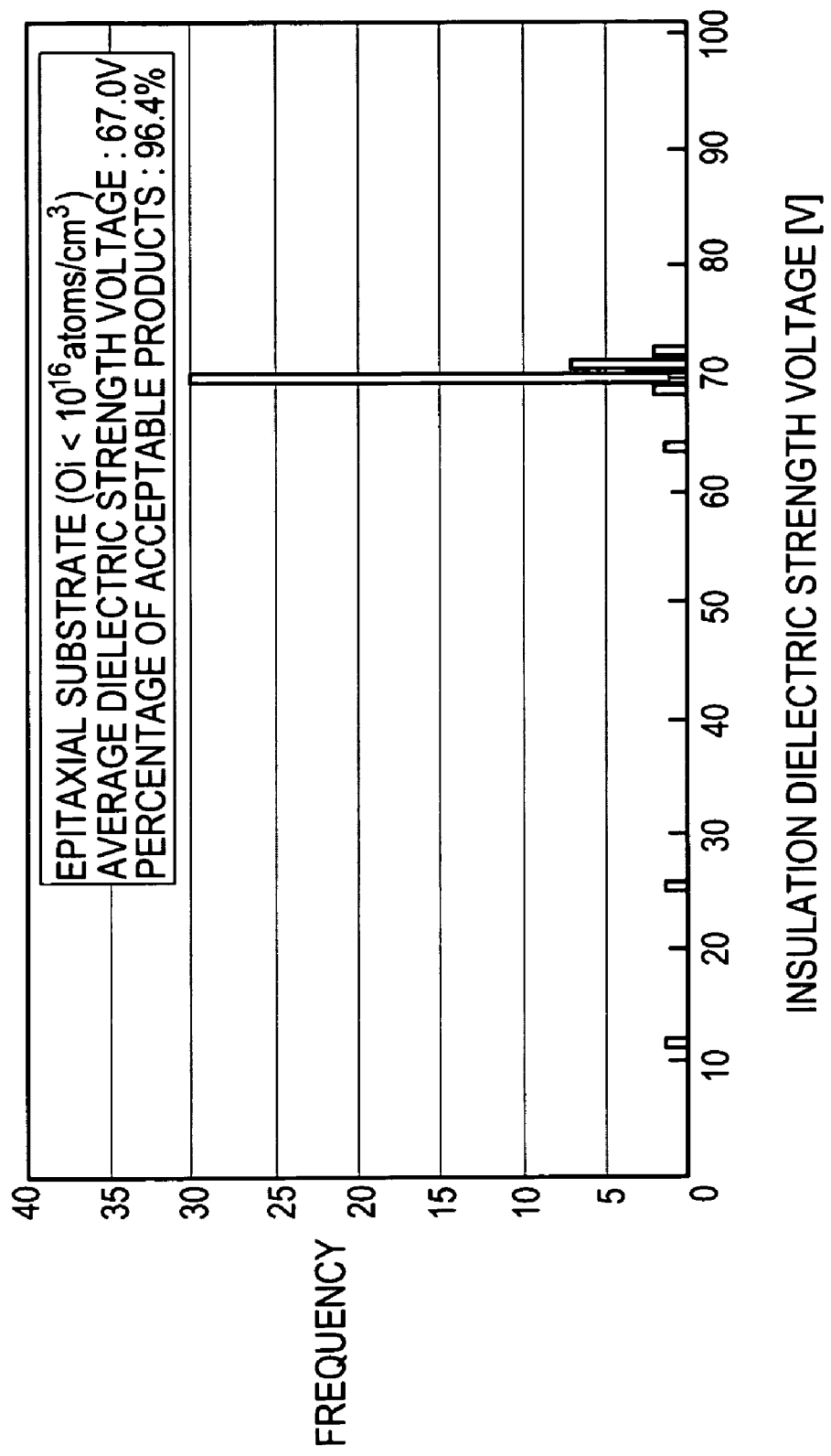
FIG. 4 is a histogram showing the distribution of gate dielectric strength voltage in the semiconductor device of conventional art (having an epitaxial layer on the CZ substrate)

FIG. 3 shows the distribution of gate dielectric strength voltage in the semiconductor device in which the IGBT device is formed on the CZ bulk substrate (oxygen concentration: $15.0 \times 10^{17}$ atoms/cm$^3$) with the CVD gate oxide film formed by using TEOS as a material gas (embodiment of the present invention). FIG. 4 shows the distribution of the gate insulation dielectric strength voltage in the semiconductor device in which an epitaxial layer (oxygen concentration: $1.0 \times 10^{15}$ atoms/cm$^3$ or less) is formed on the CZ bulk substrate and the IGBT device is formed on the epitaxial layer with an ordinary thermally oxidized film used as the gate insulation film (conventional embodiment).

Although in the current survey the average dielectric strength voltage of a conventional IGBT device (FIG. 4) was about 67.0 V, the average dielectric strength voltage of the IGBT device (FIG. 3) of this embodiment was about 81.3V. This survey result indicates that a high dielectric strength voltage is achieved in the IGBT device of this embodiment. As regards the percentage of acceptable products, while that of the conventional IGBT device was about 96.4%, that of the IGBT device of this embodiment was raised to 100%. In other words, from the results of this survey, it is evident that, as compared with a conventional IGBT device, the IGBT device of this embodiment provides a high dielectric strength voltage and an excellent yield.

Figure 5:
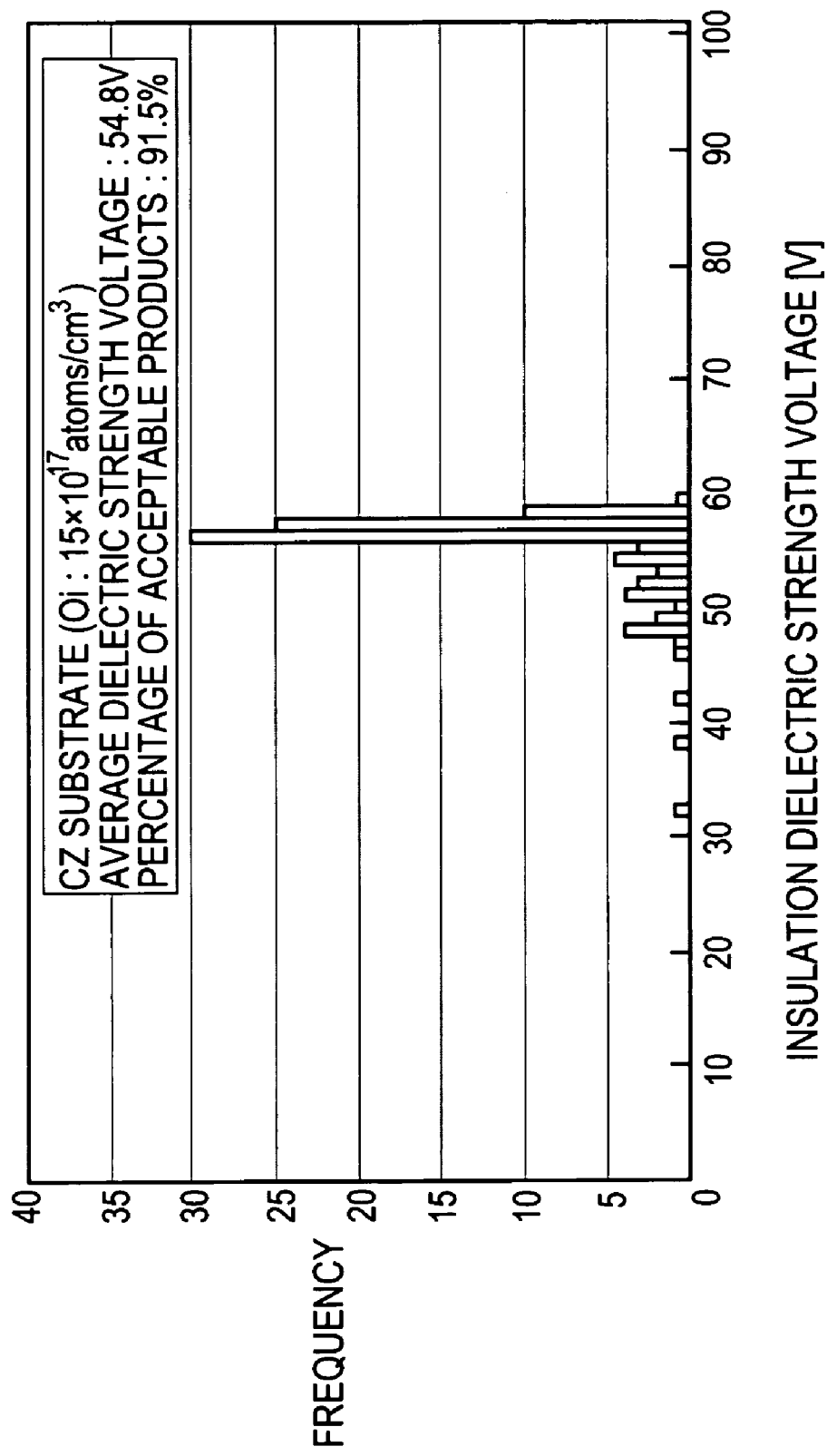
FIG. 5 is a histogram showing the distribution of gate dielectric strength voltage in a semiconductor device of the conventional art (having a low level of carbon concentration in the oxide film)

FIG. 5 shows the distribution of the gate dielectric strength voltage in a semiconductor device in which the IGBT device is formed on a CZ bulk substrate containing a high level of oxygen concentration ($15.0 \times 10^{17}$ atoms/cm$^3$) with a CVD gate oxide film formed by using SiH$_4$/N$_2$O as material gasses.

In this survey, the average dielectric strength voltage and percentage of acceptable products decreased considerably as compared with those of the IGBT device shown in FIG. 3. In other words, the CVD oxide film having a low level of carbon concentration (carbon concentration: $1.0 \times 10^{16}$ atoms/cm$^3$) provided a result that indicated that an improvement in gate dielectric strength voltage could not be expected. Thus, this survey result indicates that carbon in a CVD oxide film contributes to an improvement in the gate dielectric strength voltage.

Figure 6:
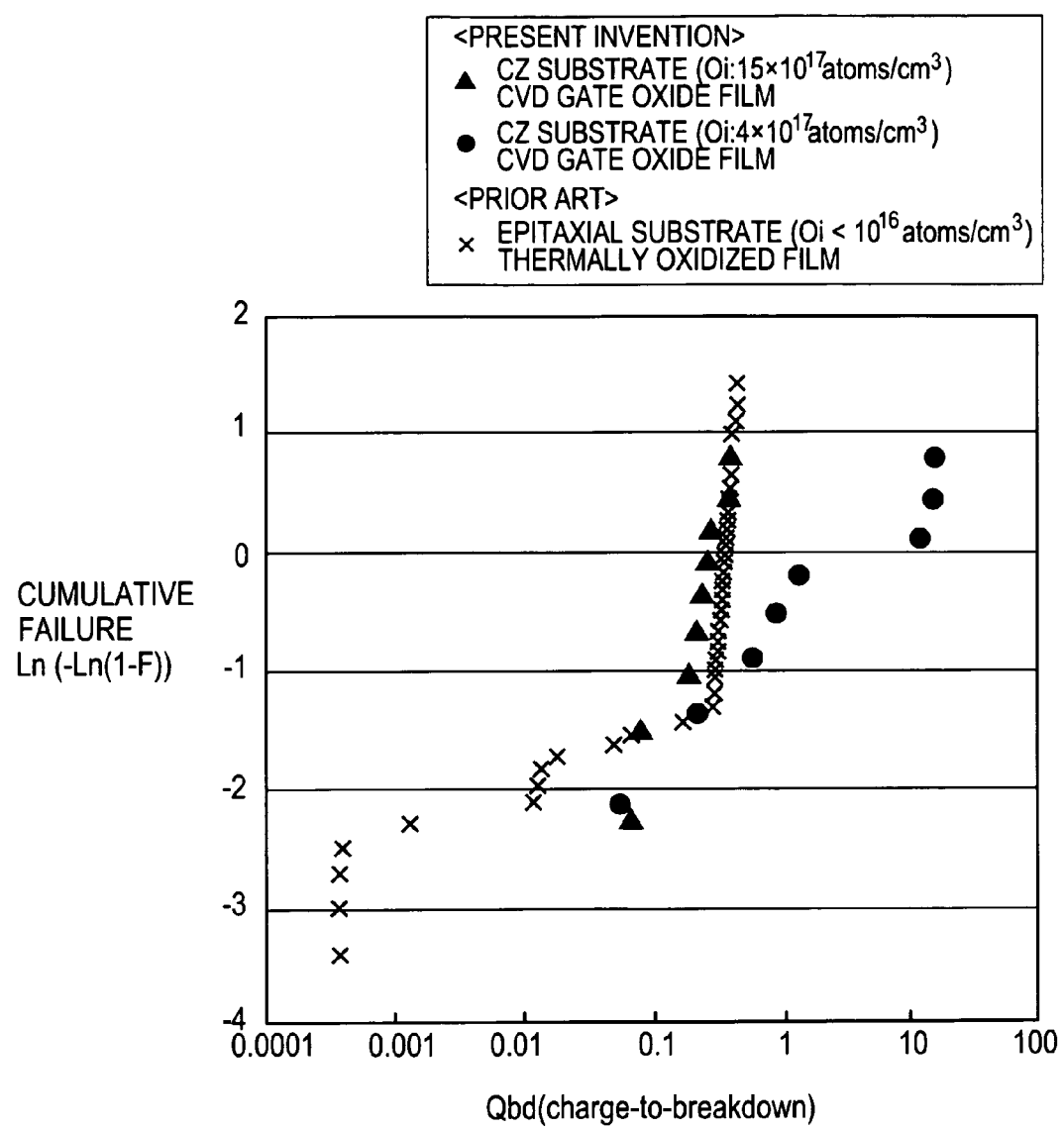
FIG. 6 is a graph showing the results of an experiment on TDDB characteristic.

FIG. 6 shows the results of evaluating long term reliability by making a time-dependent dielectric breakdown (TDDB) of the gate insulation film. In this test, as the embodiment of the present invention, a test piece having a high level of oxygen concentration (oxygen concentration: $15.0 \times 10^{17}$ atoms/cm$^3$) and a test piece having a low level of oxygen concentration ($4.0 \times 10^{17}$ atoms/cm$^3$) were prepared and test pieces were evaluated in which a CVD oxide film (carbon concentration: $1.0 \times 10^{18}$ atoms/cm$^3$) was formed on the CZ substrate. Further, as a conventional embodiment, a test piece in which an epitaxial layer was formed on the CZ substrate, and then an thermally oxidized film was formed on the epitaxial layer, was evaluated.

From the results of this survey, it is evident that the embodiment of the present invention in which the IGBT device is formed on the CZ substrate has a reliability equal to, or higher than, the conventional embodiment in which the IGBT device is formed on the epitaxial layer. Further, it is also evident that in the embodiment of the present invention in which the IGBT device is formed on the CZ substrate, the less the oxygen concentration of the CZ substrate itself, the higher the degree of reliability is.

As described in detail above, the semiconductor device 100 of this embodiment is formed on the CZ bulk substrate 10. Thus, as compared with a device in which an FZ wafer is used, the mechanical strength of the semiconductor is high, and its substrate is inexpensive. The throughput of production is high. Further, the semiconductor device 100 is formed directly on the CZ bulk substrate 10, that is, no epitaxial layer is formed, which makes the production process simple. This makes it possible to avoid an increase in cost and a decrease in throughput which result from the formation of an epitaxial layer.

The gate insulation film 24 of the semiconductor device 100 of this embodiment is formed to contain carbon of about $1.0 \times 10^{18}$ atoms/cm$^3$ just after formation of the film. After that, the carbon in this gate insulation film induces a reduction reaction with oxygen precipitate by annealing so as to remove the oxygen precipitate. As a consequence, the level of oxygen precipitate defects decreases in an area in the vicinity of the interface between the gate insulation film 24 and the CZ bulk substrate 10, thereby reducing the extent to which the gate insulation film 24 takes in the oxygen precipitate defects. Thus, even if the semiconductor device is formed on the CZ bulk substrate 10, the gate insulation dielectric strength voltage and the degree of reliability never decrease. This makes it possible to provide the insulated gate type semiconductor device and its manufacturing method, capable of suppressing a decrease in the gate insulation dielectric strength voltage and achieving a reduction in manufacturing costs.

Further, the gate insulation film 24 based on the CVD method is formed by deposition on the CZ bulk substrate 10, and the extent to which the oxygen precipitate is taken in is extremely small compared with the thermally oxidized film accompanying consumption of the silicon substrate. Further, in case of the thermally oxidized film, by including carbon in the atmospheric gas for forming the oxide film, the species of oxidation ($O_2$, $H_2O$) decrease as a result of oxidization of carbon. Thus, the oxidizing rate may locally decrease and the film may be formed unevenly. To avoid such disadvantages, the gate insulation film 24 is formed according to the CVD method, thereby suppressing a decrease in the dielectric strength voltage.

Further, the manufacturing method of the semiconductor device 100 of this embodiment is safer as a method of forming areas with a low level of defects in the CZ wafer by hydrogen annealing, and no investment in facilities is required. In other words, the semiconductor device of this embodiment can be manufactured with the use or existing equipment and initial costs are not increased. Thus, a reduction in manufacturing costs and a high dielectric strength voltage can both be easily achieved.

Furthermore, this embodiment is just an exemplification and does not restrict the present invention in any particular way. Thus, the present invention may be improved or modified in various ways within the scope not departing from the spirit of the invention. For example, in each semiconductor area, the P type and N type may be exchanged.

Furthermore, although this embodiment applies the present invention for manufacturing a trench gate-type semiconductor device, the present invention is not restricted to this particular type. For example, the present invention may be applied to a planer-type semiconductor device.

Conventionally, technologies have been disclosed for improving hot-carrier dielectric strength voltage by deliberately loading the gate insulation film with carbon atoms. However, these technologies have not addressed the question of forming a gate insulation film directly on a CZ substrate with a high degree of oxygen concentration. Generally it is considered that a decrease in dielectric strength voltage is induced if a gate insulation film is formed on a CZ substrate having a high degree of oxygen concentration. Thus, generally, a FZ wafer having a low degree of oxygen concentration, or a CZ wafer in which an epitaxial layer is formed is used. The present invention is different from the conventional techniques in that the gate insulation film is formed directly on the CZ substrate.

In the past, a technique has been disclosed for eliminating unevenness of film thickness and film quality originating from differences in surface orientation, by means of forming the oxide film according to the CVD method as the gate insulation film. However, the present invention is configured not only to improve the uniformity of film thickness and the film quality, but also to suppress a decrease in dielectric strength voltage and achieving simplification of the manufacturing process and a reduction in manufacturing costs. In other words, the present invention is different from the conventional techniques in that the gate insulation film containing a predetermined amount of carbon is formed so as to come into contact with the CZ substrate itself.

What is claimed is:

1. A manufacturing method of an insulated gate type semiconductor device, comprising:
    forming a silicon substrate having a surface with no epitaxial layer;
    forming a gate trench in the silicon substrate;
    forming on both the surface of the silicon substrate and on a surface of the gate trench a gate insulation film having a carbon content of more than $1.0 \times 10^{17}$ atoms/cm$^3$, wherein the gate insulation film directly contacts the surface of the silicon substrate, and the surface of the trench;
    depositing a gate material within the gate trench;
    annealing the silicon substrate on which the insulation film has been formed, at a temperature of 900° C. or higher, wherein the annealing induces a reduction reaction of the carbon in the gate insulation film, and wherein oxygen precipitate is removed from the gate insulation film.

2. The manufacturing method of an insulated gate-type semiconductor device according to claim 1, wherein the gate insulation film is formed according to a chemical vapor growth method (a CVD method) with a carbon organic material used as a material gas.

3. The method of claim 1, wherein the silicon substrate is a Czochralski (CZ) substrate.

4. The method of claim 1, further comprising forming a diffused layer on the surface of the silicon substrate by ion implantation or thermal diffusion.

5. A manufacturing method of an insulated gate-type semiconductor device, comprising:
    forming a silicon substrate having a surface with no epitaxial layer;
    forming a gate trench in the silicon substrate;
    forming on both the surface of the silicon substrate and on a surface of the gate trench a gate insulation film having a higher concentration of carbon than an oxygen concentration of the silicon substrate, wherein the gate insulation film directly contacts the surface of the silicon substrate, and the surface of the trench;
    depositing a gate material within the gate trench;
    annealing the silicon substrate on which the insulation film has been formed, at a temperature of 900° C. or higher, wherein the annealing induces a reduction reaction of the carbon in the gate insulation film, and wherein oxygen precipitate is removed from the gate insulation film.

6. The manufacturing method of an insulated gate-type semiconductor device according to claim 5, wherein the gate insulation film is formed according to a chemical vapor growth method (a CVD method) with a carbon organic material used as a material gas.

7. The method of claim 5, wherein the silicon substrate is a Czochralski (CZ) substrate.

8. The method of claim 5, further comprising forming a diffused layer on the surface of the silicon substrate by ion implantation or thermal diffusion.

9. A manufacturing method of an insulated gate type semiconductor device, comprising:

preparing a silicon substrate having a surface with no epitaxial layer;

forming on both the surface of the silicon substrate and on a surface of a gate trench a gate insulation film having a carbon content of more than $1.0 \times 10^{17}$ atoms/cm$^3$, wherein the gate insulation film directly contacts the surface of the silicon substrate, and the surface of the trench;

depositing a gate material within the gate trench;

annealing the silicon substrate on which the insulation film has been formed, at a temperature of 900° C. or higher, wherein the annealing induces a reduction reaction of the carbon in the gate insulation film, and wherein oxygen precipitate is removed from the gate insulation film.

10. The manufacturing method of claim 9, wherein the silicon substrate is a Czochralski (CZ) substrate.

11. The method of claim 9, further comprising forming a diffused layer on the surface of the silicon substrate by ion implantation or thermal diffusion.

12. A manufacturing method of an insulated gate-type semiconductor device, comprising:

preparing a silicon substrate having a surface with no epitaxial layer;

forming on both the surface of the silicon substrate and on a surface of a gate trench a gate insulation film having a higher concentration of carbon than an oxygen concentration of the silicon substrate, wherein the gate insulation film directly contacts the surface of the silicon substrate, and the surface of the trench;

depositing a gate material within the gate trench;

annealing the silicon substrate on which the insulation film has been formed, at a temperature of 900° C. or higher, wherein the annealing induces a reduction reaction of the carbon in the gate insulation film, and wherein oxygen precipitate is removed from the gate insulation film.

13. The manufacturing method of claim 12, wherein the silicon substrate is a Czochralski (CZ) substrate.

14. The method of claim 12, further comprising forming a diffused layer on the surface of the silicon substrate by ion implantation or thermal diffusion.

* * * * *